United States Patent
Yoshihara et al.

(10) Patent No.: US 8,318,247 B2
(45) Date of Patent: Nov. 27, 2012

(54) COATING TREATMENT METHOD, COATING TREATMENT APPARATUS, AND COMPUTER-READABLE STORAGE MEDIUM

(75) Inventors: Kousuke Yoshihara, Koshi (JP); Tomohiro Iseki, Koshi (JP); Koji Takayanagi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1115 days.

(21) Appl. No.: 12/205,999

(22) Filed: Sep. 8, 2008

(65) Prior Publication Data

US 2009/0087559 A1 Apr. 2, 2009

(30) Foreign Application Priority Data

Sep. 27, 2007 (JP) ................. 2007-251056

(51) Int. Cl.
*B05D 3/12* (2006.01)
(52) U.S. Cl. .......... 427/240; 427/425; 118/52; 118/320; 438/780; 438/782
(58) Field of Classification Search .............. 427/240, 427/425; 118/52, 320; 438/758, 780, 782
See application file for complete search history.

(56) References Cited

U.S. PATENT DOCUMENTS

| | | | | |
|---|---|---|---|---|
| 5,672,205 A | * | 9/1997 | Fujimoto et al. | 211/13.1 |
| 5,976,620 A | * | 11/1999 | Sanada et al. | 427/240 |
| 6,117,486 A | | 9/2000 | Yoshihara | |
| 8,043,657 B2 | * | 10/2011 | Yoshihara et al. | 427/240 |
| 2007/0092642 A1 | | 4/2007 | Yoshihara et al. | |

FOREIGN PATENT DOCUMENTS

| | | |
|---|---|---|
| JP | 5-234869 | 9/1993 |
| JP | 10-151406 | 6/1998 |
| JP | 11-297589 | 10/1999 |
| JP | 2001-307984 | 11/2001 |
| JP | 2006-156565 | 6/2006 |
| JP | 2007-115936 | 5/2007 |

OTHER PUBLICATIONS

Office Action issued Dec. 31, 2010, in China Patent Application No. 200810161932.9 (with English translation).
Office Action issued Sep. 20, 2011 in Japan Application No. 2007-251056 (With English Translation).

* cited by examiner

*Primary Examiner* — Kristen Jolley
(74) *Attorney, Agent, or Firm* — Oblon, Spivak, McClelland, Maier & Neustadt, L.L.P.

(57) ABSTRACT

The present invention includes: a first step of discharging a coating solution from a nozzle to a center portion of the substrate to apply the coating solution on a surface of the substrate while rotating the substrate; a second step of decelerating, after the first step, the rotation of the substrate and continuously rotating the substrate; and a third step of accelerating, after the second step, the rotation of the substrate to dry the coating solution on the substrate, wherein: the substrate is rotated at a fixed speed of a first speed immediately before the first step; and in the first step, the rotation of the substrate which is at the first speed before start of the first step is gradually accelerated after the start of the first step so as to make the speed continuously change, and the acceleration of the rotation of the substrate is gradually decreased so as to make the speed of the rotation of the substrate converge in a second speed higher than the first speed at end of the first step.

2 Claims, 12 Drawing Sheets

FIG.8

(a) PRESENT INVENTION

| | | AMOUNT OF RESIST SOLUTION DISCHARGED (ml) | | | | | | | | | | | |
|---|---|---|---|---|---|---|---|---|---|---|---|---|---|
| | | 0.7 | 0.8 | 0.9 | 1.0 | 1.1 | 1.2 | 1.3 | 1.4 | 1.5 | 1.6 | 1.7 | 1.8 |
| ROTATION SPEED | 2000rpm | NG | NG | NG | NG | OK | OK | OK | OK | OK | OK | OK | OK |
| | 3000rpm | NG | NG | NG | NG | OK | OK | OK | OK | OK | OK | OK | OK |
| | 4000rpm | NG | NG | NG | OK | OK | OK | OK | OK | OK | OK | OK | OK |

(b) CONVENTIONAL EXAMPLE

| | | AMOUNT OF RESIST SOLUTION DISCHARGED (ml) | | | | | | | | | | | |
|---|---|---|---|---|---|---|---|---|---|---|---|---|---|
| | | 0.7 | 0.8 | 0.9 | 1.0 | 1.1 | 1.2 | 1.3 | 1.4 | 1.5 | 1.6 | 1.7 | 1.8 |
| ROTATION SPEED | 2000rpm | NG | NG | NG | NG | OK | OK | OK | OK | OK | OK | OK | OK |
| | 3000rpm | NG | NG | NG | NG | NG | OK | OK | OK | OK | OK | OK | OK |
| | 4000rpm | NG | NG | NG | NG | NG | OK | OK | OK | OK | OK | OK | OK |

(a)

(b)

COATING TREATMENT METHOD, COATING TREATMENT APPARATUS, AND COMPUTER-READABLE STORAGE MEDIUM

BACKGROUND OF THE INVENTION

1. Field of the Invention

The present invention relates to a coating treatment method for a substrate, a coating treatment apparatus for a substrate, and a computer-readable recording medium.

2. Description of the Related Art

For example, in a photolithography process of manufacturing processes of a semiconductor device, resist coating treatment for forming a resist film by applying a resist solution on, for example, a wafer, exposure processing for exposing the resist film to a predetermined pattern, developing treatment for developing the exposed resist film, and so on are sequentially performed, whereby a predetermined resist pattern is formed on the wafer.

In the aforesaid resist coating treatment, often used is a so-called spin coating treatment method of applying a resist solution on a surface of a wafer by supplying the resist solution from a nozzle to a center portion of the wafer which is rotated at high speed and diffusing the resist solution on the wafer by a centrifugal force. As a method of uniformly applying the resist solution in this spin coating treatment method, there has been proposed, for example, a method in which a resist solution is supplied to a wafer which is rotated at high speed, thereafter the rotation speed of the wafer is once decreased to planarize the resist solution on the wafer, the rotation speed of the wafer is thereafter increased again to dry the resist solution on the wafer (see Japanese Patent Application Laid-open No. 2007-115936).

SUMMARY OF THE INVENTION

However, as the miniaturization of circuits of semiconductor devices progresses, a resist film in the resist coating treatment is made thinner. Further, since the resist solution is expensive, an amount of the resist solution used needs to be reduced as much as possible. From this viewpoint, reducing an amount of the resist solution supplied to a wafer has been considered, but in this case, if the resist solution is supplied to the center of the wafer which is rotated at high speed as has been conventionally done, the resist solution rapidly spreads outward from the center of the wafer, so that coating mottles in a streak shape are sometimes made near the center of the wafer. Such coating mottles cause, for example, focus deviation in the exposure processing, and a resist pattern finally formed on the wafer does not have a desired size.

The present invention was made in view of such a problem, and its object is to realize uniform application of a coating solution such as a resist solution on a surface of a substrate such as a wafer even when an amount of the coating solution applied is small, in a case where the coating solution is applied on the substrate by a spin coating treatment method.

To attain the above object, the present invention is a coating treatment method for a substrate, including: a first step of discharging a coating solution from a nozzle to a center portion of the substrate while rotating the substrate, to apply the coating solution on a surface of the substrate; a second step of decelerating, after the first step, the rotation of the substrate and continuously rotating the substrate; and a third step of accelerating, after the second step, the rotation of the substrate to dry the coating solution on the substrate. The substrate is rotated at a fixed speed of a first speed immediately before the first step, and in the first step, the rotation of the substrate which is at the first speed before start of the first step is gradually accelerated after the start of the first step so as to make the speed continuously change, and the acceleration of the rotation of the substrate is gradually decreased so as to make the speed of the rotation of the substrate converge in a second speed higher than the first speed at end of the first step.

By continuously changing the rotation speed of the substrate in the first step as in the present invention, it is possible to uniformly apply the coating solution even if an amount of the coating solution applied is reduced. This enables the formation of a thinner coating film on the substrate. Further, this realizes cost reduction.

The discharging of the coating solution from the nozzle in the first step may be continued until a middle of the second step, and when the discharging of the coating solution is to be ended, the nozzle may be moved to deviate a discharging position of the coating solution from the center portion of the substrate.

The movement of the nozzle may be started simultaneously with the end of the first step. It should be noted that "simultaneously" here also includes substantially simultaneously within a 0.5 seconds before and after the end of the first step.

The present invention according to another aspect is a coating treatment apparatus for a substrate including: a rotating and holding part holding and rotating the substrate; a nozzle discharging a coating solution to the substrate; and a control part controlling operations of the rotating and holding unit and the nozzle. The control part executes: a first step of discharging the coating solution from the nozzle to a center portion of the substrate while the substrate is rotated by the rotating and holding unit, to apply the coating solution on a surface of the substrate; a second step of decelerating, after the first step, the rotation of the substrate and continuously rotating the substrate; and a third step of accelerating, after the second step, the rotation of the substrate to dry the coating solution on the substrate, and controls the operations of the rotating and holding unit and the nozzle in a manner that: the substrate is rotated at a fixed speed of a first speed immediately before the first step; and in the first step, the rotation of the substrate which is at the first speed before start of the first step is gradually accelerated after the start of the first step so as to make the speed continuously change, and the acceleration of the rotation of the substrate is gradually decreased so as to make the speed of the rotation of the substrate converge in a second speed higher than the first speed at end of the first step.

The coating treatment apparatus may further include a nozzle moving mechanism moving the nozzle in a diameter direction of the substrate from a position above the center portion of the substrate, and the control part may operate in a manner that the discharging of the coating solution from the nozzle in the first step is continued until a middle of the second step, and when the discharging of the coating solution is to be ended in the second step, the nozzle is moved to deviate a discharging position of the coating solution from the center portion of the substrate.

The movement of the nozzle may be started simultaneously with the end of the first step.

According to the present invention of still another aspect, there is provided a computer-readable storage medium storing a program which operates on a computer of the control part controlling the coating treatment apparatus in order to cause the coating treatment apparatus to execute the aforesaid coating treatment method.

BRIEF DESCRIPTION OF THE DRAWINGS

FIG. 8(a) is a table showing the result of an experiment regarding a discharging amount of a resist solution which is necessary to achieve the application of the resist solution without any mottle when a coating treatment method in this embodiment is used, and FIG. 8(b) is a table showing the result of an experiment regarding a discharging amount of a resist solution which is necessary to achieve the application of the resist solution without any mottle when a conventional coating treatment method is used;

DETAILED DESCRIPTION OF THE INVENTION

Figure 1:
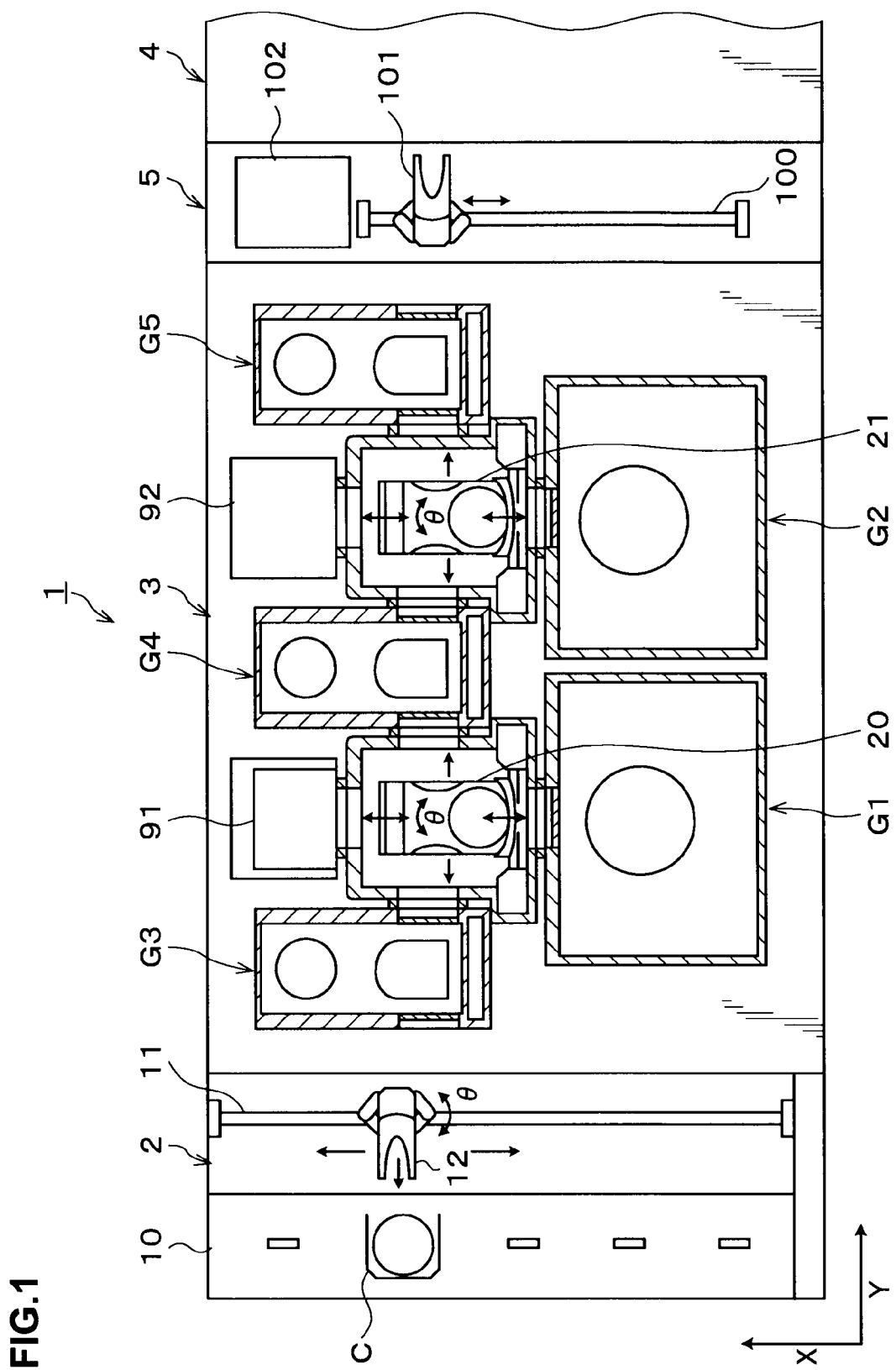
FIG. 1 is a plane view schematically showing the structure of a coating and developing system.
Figure 2:
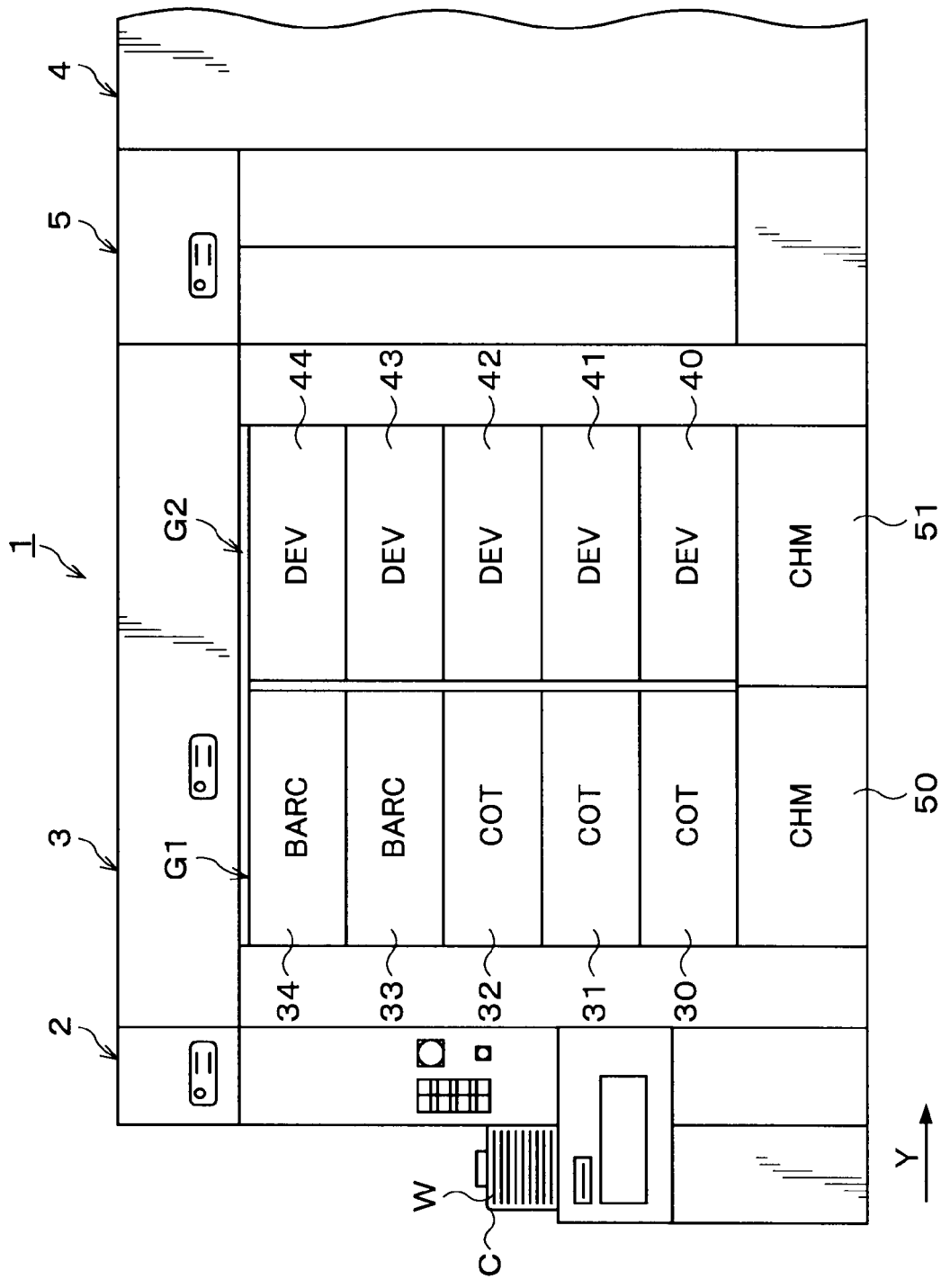
FIG. 2 is a front view of the coating and developing system.
Figure 3:
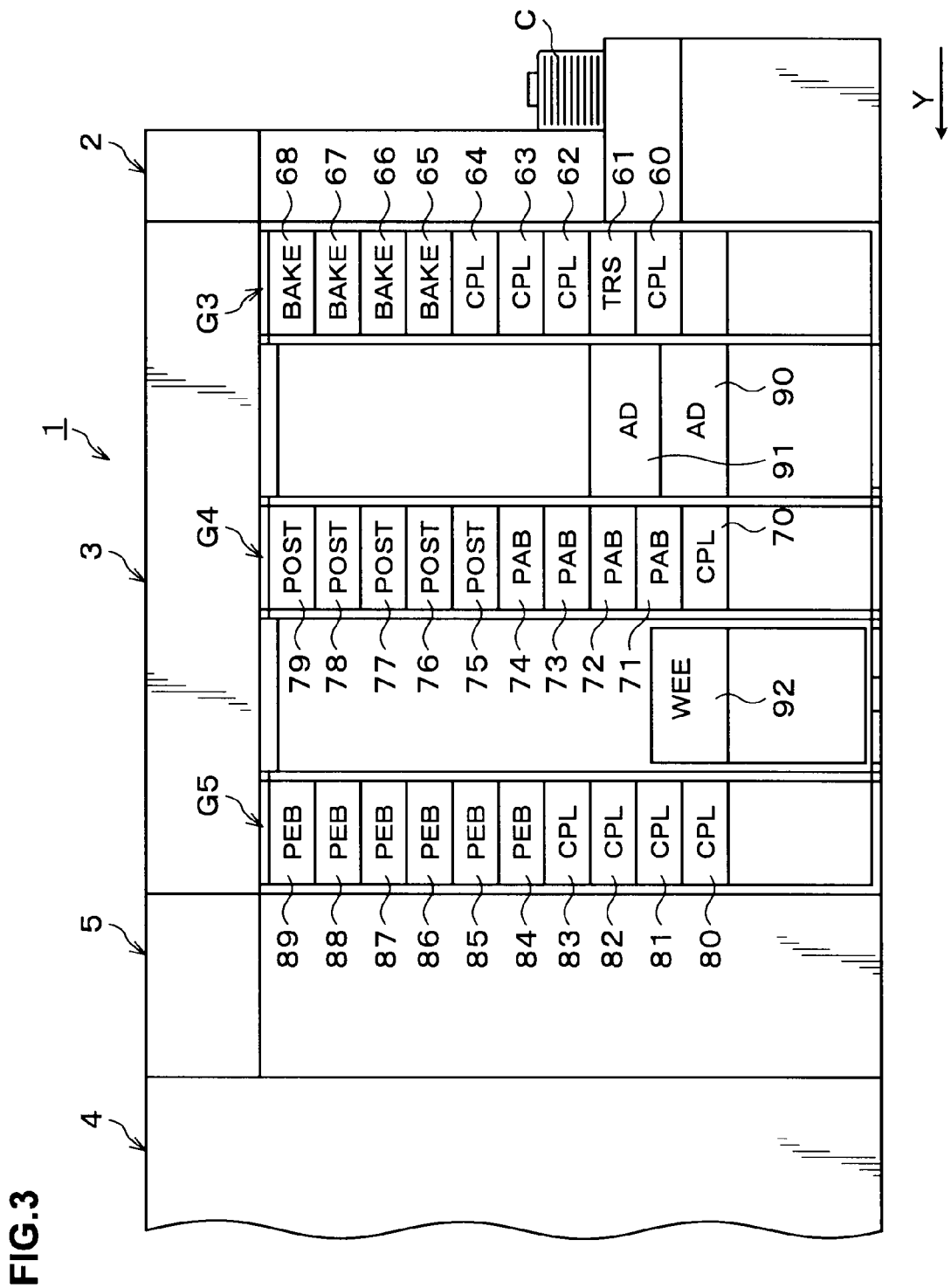
FIG. 3 is a rear view of the coating and developing system.

Hereinafter, a preferred embodiment of the present invention will be described. FIG. 1 is a plane view schematically showing the configuration of a coating and developing treatment system 1 in which coating treatment apparatus according to this embodiment are mounted, FIG. 2 is a front view of the coating and developing system 1, and FIG. 3 is a rear view of the coating and developing system 1.

As shown in FIG. 1, the coating and developing system 1 includes: a cassette station 2 via which a plurality of wafers W are loaded/unloaded in a unit of a cassette from/to, for example, an external part to/from the coating and developing system 1; a processing station 3 including plural processing units of various kinds applying predetermined wafer-by-wafer processing in a photolithography process; and an interface station 5 provided adjacent to the processing station 3 to carry the wafer W to/from an exposure unit 4, and these cassette station 2, processing station 3, and interface station 5 are integrally connected.

In the cassette station 2, a cassette mounting table 10 is provided, and a plurality of cassettes C can be placed in line in an X direction (up/down direction in FIG. 1) on the cassette mounting table 10. In the cassette station 2, a wafer carrier 12 movable in the X direction on a carrier path 11 is provided. The wafer carrier 12 is also movable in an arrangement direction (Z direction; vertical direction) of the wafers W put in the cassette C, and can selectively access the plural wafers W in the cassette C. Further, the wafer carrier 12 is rotatable around a vertical axis (θ direction), and can access later-described processing units of a third processing unit group G3 of the processing station 3 to carry the wafer W to these processing units.

The processing station 3 includes, for example, five processing unit groups G1 to G5 in each of which the plural processing units are arranged in multi tiers. On an X-direction negative side (lower side in FIG. 1) in the processing station 3, the first processing unit group G1 and the second processing unit group G2 are arranged in this order from the cassette station 2 side toward the interface station 5 side. On an X-direction positive side (upper side in FIG. 1) in the processing station 3, the third processing unit group G3, the fourth processing unit group G4, and the fifth processing unit group G5 are arranged in this order from the cassette station 2 side toward the interface station 5 side. Between the third processing unit group G3 and the fourth processing unit group G4, a first carrier 20 is provided. The first carrier 20 can selectively access the units in the first processing unit group G1, the third processing unit group G3, and the fourth processing unit group G4 to carry the wafer W to these units. Between the fourth processing unit group G4 and the fifth processing unit group G5, a second carrier 21 is provided. The second carrier 21 can selectively access the units of the second processing unit group G2, the fourth processing unit group G4, and the fifth processing unit group G5 to carry the wafer W to these units.

As shown in FIG. 2, in the first processing unit group G1, liquid treatment units treating the wafer W by supplying the wafer with predetermined liquids, for example, resist coating treatment apparatus 30, 31, 32 each being the coating treatment apparatus according to this embodiment, and bottom coating treatment apparatus 33, 34 forming an anti-reflection film preventing the reflection of light during the exposure processing are stacked in five tiers in this order from the bottom. In the second processing unit group G2, liquid treatment units, for example, developing units 40 to 44 performing developing treatment by supplying a developing solution to the wafer W are stacked in five tiers in this order from the bottom. Further, on lowest tiers of the first processing unit group G1 and the second processing unit group G2, chemical chambers 50, 51 for supplying various treatment solutions to the liquid treatment units in the processing unit groups G1, G2 are provided respectively.

For example, as shown in FIG. 3, in the third processing unit group G3, a temperature control unit 60 for temperature control of the wafer W placed on a temperature control plate, a transition unit 61 for transferring the wafer W, temperature control units 62 to 64, and heat treatment units 65 to 68 for heat treatment of the wafer W are stacked in nine tiers in this order from the bottom.

In the fourth processing unit group G4, for example, a temperature control unit 70, pre-baking units 71 to 74 for heat treatment of the wafer W having undergone the resist coating treatment, and post-baking units 75 to 79 for heat treatment of the wafer W having undergone the developing treatment are stacked in ten tiers in this order from the bottom.

In the fifth processing unit group G5, a plurality of heat treatment units for heat treatment of the wafer W, for example, temperature control units 80 to 83 and post-exposure baking units 84 to 89 for heat treatment of the wafer W having undergone the exposure processing are stacked in ten tiers in this order from the bottom.

As shown in FIG. 1, on the X-direction positive side of the first carrier 20, a plurality of processing units are disposed, and for example, adhesion units 90, 91 for hydrophobic treatment of the wafer W are stacked in two tiers in this order from the bottom as shown in FIG. 3. As shown in FIG. 1, on the X-direction positive side of the second carrier 21, an edge exposure unit 92 for selectively radiating exposure light only to an edge portion of the wafer W is disposed, for instance.

For example, as shown in FIG. 1, in the interface station 5, a wafer carrier 101 moving on a carrier path 100 extending in the X direction and a buffer cassette 102 are provided. The wafer carrier 101 is movable in the Z direction and rotatable in the θ direction, and it can access the exposure unit 4 adjacent to the interface station 5, the buffer cassette 102, and the units of the fifth processing unit group G5 to carry the wafer W thereto.

The exposure unit 4 in this embodiment performs, for example, liquid-immersion exposure processing and while a film of liquid, for example, pure water stays on the surface of the wafer W, the exposure unit 4 can radiate the exposure light to a resist film on the surface of the wafer W via the liquid film of pure water.

Figure 4:
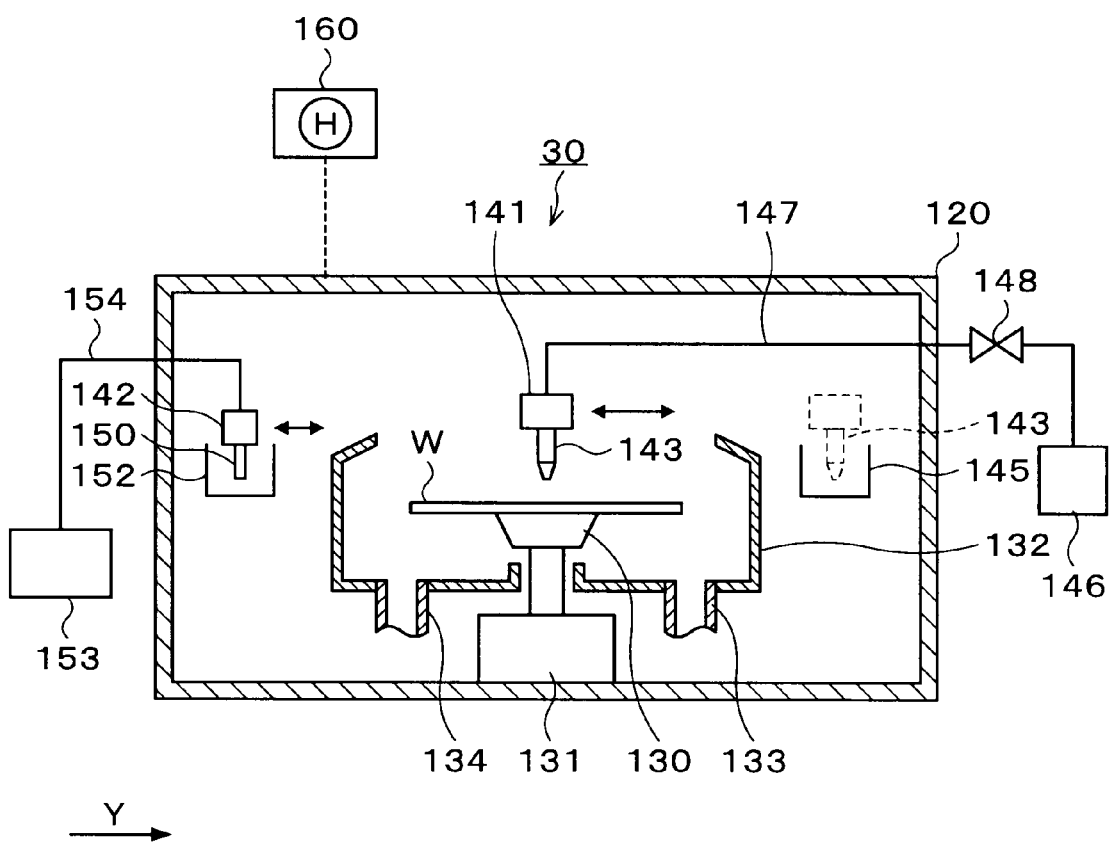
FIG. 4 is an explanatory view of a vertical section schematically showing the structure of a resist coating treatment apparatus.
Figure 5:
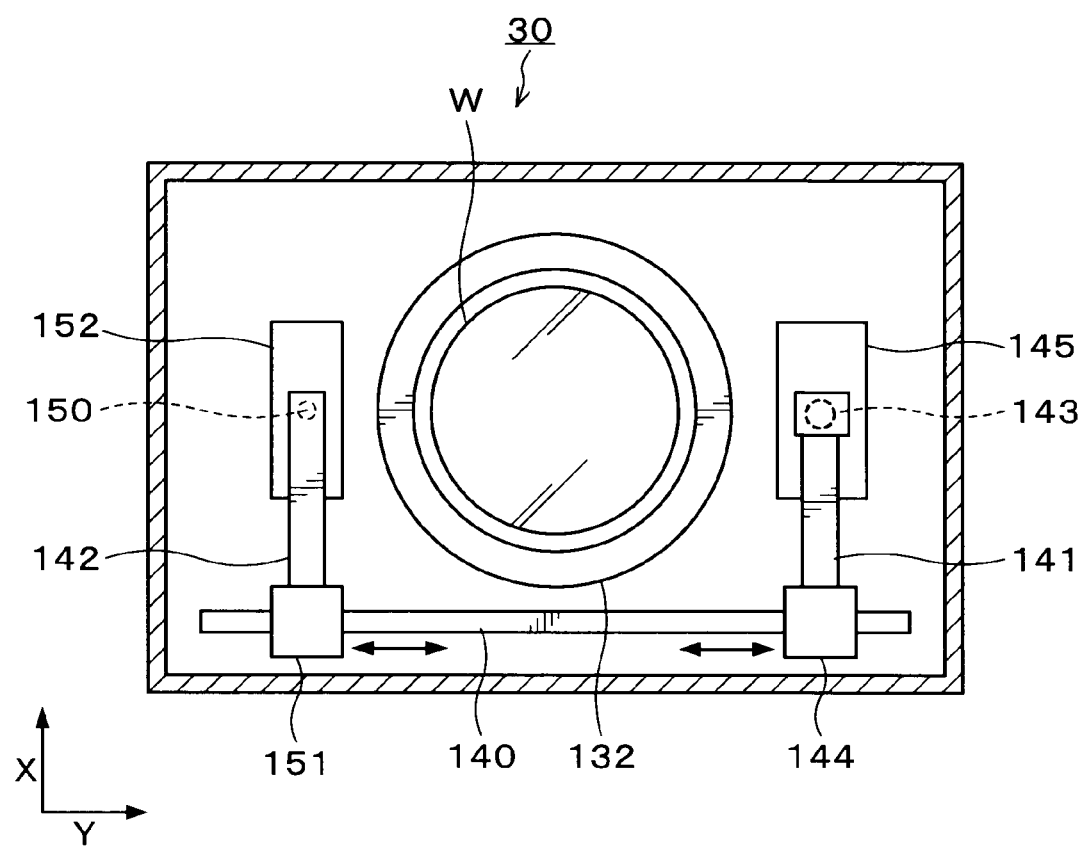
FIG. 5 is an explanatory view of a horizontal section schematically showing the structure of the resist coating treatment apparatus.

Next, the structure of the aforesaid resist coating treatment apparatus 30 to 32 will be described. FIG. 4 is an explanatory view of a vertical cross section schematically showing the structure of the resist coating treatment apparatus 30, and FIG. 5 is an explanatory view of a horizontal section schematically showing the structure of the resist coating treatment apparatus 30.

For example, as shown in FIG. 4, the resist coating treatment apparatus 30 has a casing 120, and a spin chuck 130 as a rotating and holding unit for holding and rotating the wafer W is provided at a center portion in the casing 120. The spin chuck 130 has a horizontal upper surface, and for example, a suction port (not shown) from which the wafer W is sucked is provided on this upper surface. Owing to the suction from the suction port, the wafer W can be suction-held on the spin chuck 130.

The spin chuck 130 has a chuck driving mechanism 131 including, for example, a motor and so on, and can be rotated at a predetermined speed by the chuck driving mechanism 131. The chuck driving mechanism 131 further has a lifting driving source such as a cylinder, and thus the spin chuck 130 is movable up and down. The rotation speed of the spin chuck 130 is controlled by a later-described control part 160.

Around the spin chuck 130, provided is a cup 132 receiving and collecting the liquid scattering or dropping from the wafer W. A discharge pipe 133 through which the collected liquid is discharged and an exhaust pipe 134 through which atmosphere in the cup 132 is discharged are connected to a lower surface of the cup 132.

As shown in FIG. 5, on the X-direction negative side (lower side in FIG. 5) of the cup 132, a rail 140 extending in a Y direction (right/left direction in FIG. 5) is formed. The rail 140 extends, for example, from a Y-direction negative side (left side in FIG. 5) outer position of the cup 132 to a Y-direction positive side (right side in FIG. 5) outer position of the cup 132. For example, two arms 141, 142 are attached to the rail 140.

The first arm 141 supports a first nozzle 143 discharging the resist solution as the coating solution as shown in FIG. 4 and FIG. 5. The first arm 141 is movable on the rail 140 by a nozzle driving part 144 shown in FIG. 5. Therefore, the first nozzle 143 can move from a standby part 145 installed on the Y-direction positive side outer position of the cup 132 to a position above the center portion of the wafer W in the cup 132, and can further move above the surface of the wafer W in a diameter direction of the wafer W. Further, the first arm 141 is movable up and down by the nozzle driving part 144 so that the height of the first nozzle 143 can be adjusted. In this embodiment, the aforesaid first arm 141 and nozzle driving part 144 form a "nozzle moving mechanism".

A supply pipe 147 communicating with a resist solution supply source 146 is connected to the first nozzle 143 as shown in FIG. 4. In the resist solution supply source 146 in this embodiment, a low-viscosity resist solution for forming, for example, a thin resist film with, for example, a 150 nm thickness or less is stored. Further, a valve 148 is provided in the supply pipe 147, and it is possible to set ON/OFF of the discharging of the resist solution by opening/closing the valve 148.

The second arm 142 supports a second nozzle 150 discharging a solvent of the resist solution. The second arm 142 is movable on the rail 140 by a nozzle driving part 151 shown in FIG. 5, for instance, and the second nozzle 150 can be moved from a standby part 152 provided on the Y-direction negative side outer position of the cup 132 up to the position above the center portion of the wafer W in the cup 132. Further, the second arm 142 is movable up and down by the nozzle driving part 151 so that the height of the second nozzle 150 can be adjusted.

A supply pipe 154 communicating with a solvent supply source 153 is connected to the second nozzle 150 as shown in FIG. 4. In the above-described structure, the first nozzle 143 discharging the resist solution and the second nozzle 150 discharging the solvent are supported by the separate arms, but they may be supported by the same arm, and the movement and the discharging timings of the first nozzle 143 and the second nozzle 150 may be controlled through the control over the movement of the arm.

The control part 160 controls the operations of the driving system, such as the rotation operation by the spin chuck 130, the operation of moving the first nozzle 143 by the nozzle driving part 144, the operation of ON/OFF setting of the discharging of the resist solution of the first nozzle 143 by the valve 148, and the operation of moving the second nozzle 150 by the nozzle driving part 151. The control part 160 is, for example, a computer including a CPU, a memory, and so on, and executes programs stored in, for example, the memory to be capable of realizing the resist coating treatment in the resist coating treatment apparatus 30. As the various programs for realizing the resist coating treatment in the resist coating treatment apparatus 30, used are those stored in, for example, a computer-readable storage medium H such as a CD and installed from the storage medium H to the control part 160.

The resist coating treatment apparatus 31, 32 have the same structure as that of the above-described resist coating treatment apparatus 30, and therefore, description thereof will be omitted.

Next, processes of the coating treatment performed in the resist coating treatment apparatus 30 as configured above will be described together with processes of wafer processing performed in the whole coating and developing system 1.

First, unprocessed wafers W are taken out one by one from the cassette C on the cassette mounting table 10 by the wafer carrier 12 shown in FIG. 1 to be sequentially carried to the processing station 3. The wafer W is carried to the temperature control unit 60 belonging to the third processing unit group G3 of the processing station 3, to be temperature-controlled to a predetermined temperature. Thereafter, the wafer W is carried by the first carrier 20 to, for example, the bottom coating treatment apparatus 34, where the anti-reflection film is formed on the wafer W. Thereafter, the wafer W is carried by the first carrier 20 to, for example, the heat treatment unit 65 and the temperature control unit 70 in sequence to undergo predetermined processing in the respective units. Thereafter, the wafer W is carried to, for example, the resist coating treatment apparatus 30 by the first carrier 20.

Figure 6:
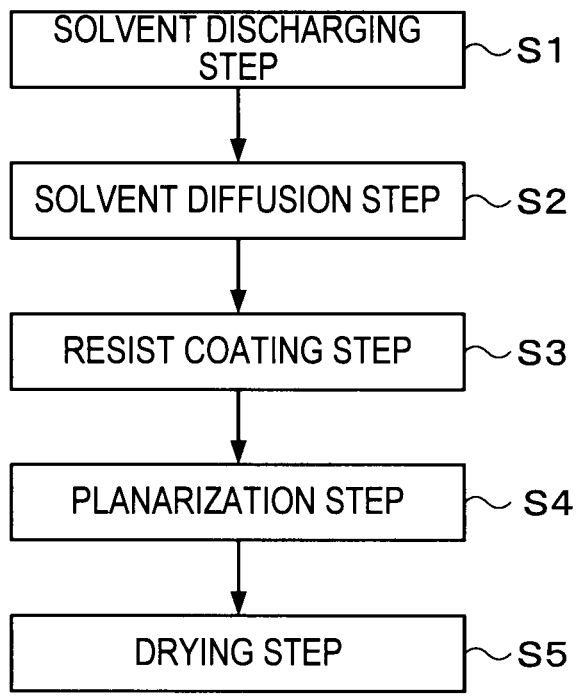
FIG. 6 is a flowchart showing main steps of resist coating treatment.
Figure 7:
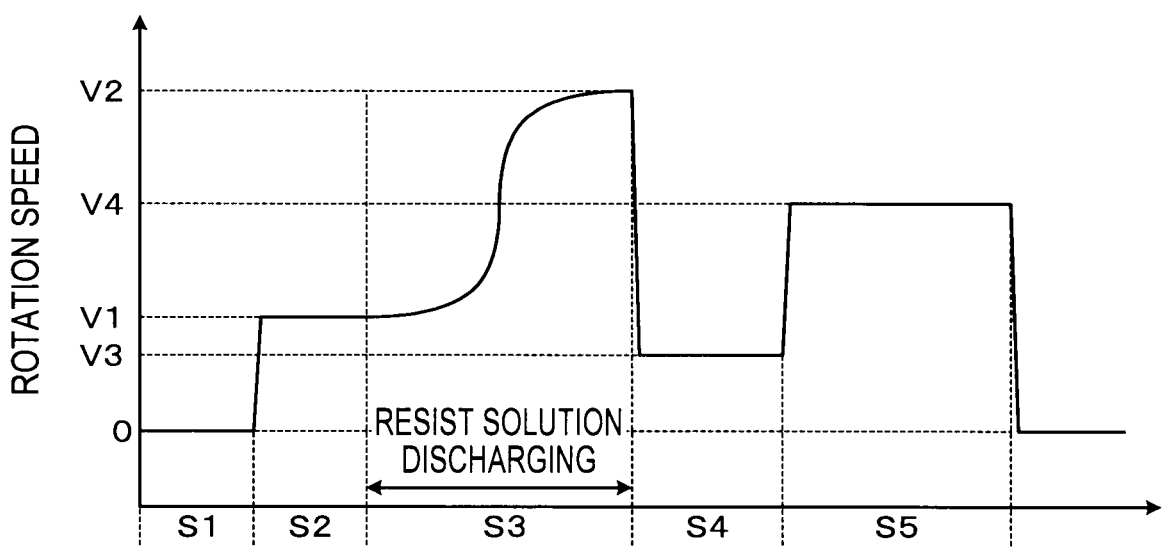
FIG. 7 is a graph showing rotation speed of a wafer in each of the steps of the resist coating treatment.

FIG. 6 is a flowchart showing main steps of the coating treatment in the resist coating treatment apparatus 30. FIG. 7 is a graph showing the rotation speed of the wafer W in each of the steps of the coating treatment.

First, after carried to the resist coating treatment apparatus 30, the wafer W is suction-held by the spin chuck 130 as shown in FIG. 4. Subsequently, the second nozzle 150 at the standby part 152 is moved by the second arm 142 to the position above the center portion of the wafer W. Next, for example, while the wafer W is kept stopped, a predetermined amount of the solvent is discharged from the second nozzle 150 to be supplied to the center portion of the wafer W (a solvent discharging step S1 in FIG. 6). Thereafter, as shown in FIG. 7, the wafer W is rotated by the spin chuck 130 at a first speed V1 which is, for example, about 500 rpm, so that the solvent on the wafer W is diffused all over the surface of the wafer W, so that the solvent is applied on the surface of the wafer W (a solvent diffusion step S2 in FIG. 6). For example, at this time, the first nozzle 143 at the standby part 145 is moved by the first arm 141 to the position above the center portion of the wafer W.

Thereafter, the valve 148 is opened, so that the discharging of the resist solution from the first nozzle 143 is started as shown in FIG. 7 and the supply of the resist solution to the center portion of the wafer W is started. In this manner, a resist solution coating step S3 (first step in the present invention) is started. In the coating step S3, the rotation speed of the wafer W is increased from the first speed V1 to a second speed V2 which is a high speed of, for example, about 2500 rpm. The rotation of the wafer W which is at the first speed V1 before the start of the coating step S3 is thereafter gradually accelerated so that the speed changes continuously and smoothly. At this time, the acceleration of the rotation of the wafer W increases gradually from, for example, zero. Then, the acceleration of the rotation of the wafer W is gradually decreased, and the rotation speed of the wafer W smoothly converges in the second speed V2 at the end of the coating step S3. In this manner, in the coating step S3, the rotation speed of the wafer W is changed in an S-shape from the first speed V1 to the second speed V2.

In the coating step S3, the resist solution supplied to the center portion of the wafer W is diffused all over the surface of the wafer W by a centrifugal force, so that the resist solution is applied on the surface of the wafer W. The resist solution used in this embodiment is, for example, that for thin film coating with, for example, 2 cp viscosity or less.

As shown in FIG. 7, when the resist solution coating step S3 for a predetermined time is finished, the rotation speed of the wafer W is decreased to a third speed V3, which is a low speed of, for example, about 300 rpm, so that the resist solution on the wafer W is smoothed to be planarized (a planarization step S4 in FIG. 6 (a second step in the present invention)).

As shown in FIG. 7, when the planarization step S4 for a predetermined time is finished, the rotation speed of the wafer W is increased to a fourth speed V4 which is a middle speed of, for example, about 1500 rpm, so that the resist solution on the wafer W is dried (a drying step S5 in FIG. 6) (a third step in the present invention)). In this manner, a thin resist film is formed on the wafer W.

After the drying of the wafer W is finished, the rotation of the wafer W is stopped and the wafer W is carried out from the top of the spin chuck 130, whereby a series of the resist coating treatment is finished.

After the resist coating treatment, the wafer W is carried by the first carrier 20 to, for example, the pre-baking unit 71 to be pre-baked. Subsequently, the wafer W is carried by the second carrier 21 sequentially to the edge exposure unit 92 and the temperature control unit 83, where the wafer W undergoes predetermined processing. Thereafter, the wafer W is carried to the exposure unit 4 by the wafer carrier 101 of the interface station 5 to undergo the liquid-immersion exposure. Thereafter, the wafer W is carried by the wafer carrier 101 to, for example, the post-exposure baking unit 84 to undergo the post-exposure baking, and thereafter carried by the second carrier 21 to the temperature control unit 81 to be temperature-controlled. Thereafter, the wafer W is carried to the developing unit 40, where the resist film on the wafer W is developed. After the development, the wafer W is carried to the post-baking unit 75 by the second carrier 21 to be post-baked. Thereafter, the wafer W is carried to the temperature control unit 63 to be temperature-controlled. Then, the wafer W is carried to the transition unit 61 by the first carrier 20 and is returned to the cassette C by the wafer carrier 12, whereby a series of the wafer processing is finished.

According the above-described embodiment, the rotation of the wafer W whose speed is the first speed V1 before the start of the coating step S3 is gradually accelerated after the start of the coating step S3 so that the rotation speed continuously and gradually changes, and the acceleration of the rotation of the wafer W is gradually decreased so that the rotation speed of the wafer W converges in the second speed V2 at the end of the coating step S3. Therefore, coating mottles can be reduced even when an amount of the resist solution applied is small. Therefore, an amount of the resist solution used can be reduced and a thinner film can be formed. Moreover, cost reduction is achieved.

Here, the result of an experiment verifying the effects obtained from the coating treatment method according to this embodiment will be shown. FIG. 8(*a*) and FIG. 8(*b*) show the results of studies on a discharging amount of the resist solution for achieving the application of the resist solution without any mottle, in a case where the speed of the wafer W during the coating step S3 is controlled in the S-shape as in this embodiment (FIG. 8(*a*)) and in a case where the speed of the wafer W is increased to a high speed at the start of the coating step as is conventionally done (FIG. 8(*b*)). The experiment was conducted using a wafer W with a 300 mm diameter, with the rotation speed of the wafer at the end of the coating step (second speed V2) being varied. In the drawing, "OK" represents that the resist solution is smoothly applied on the entire surface of the wafer W, and "NG" represents that coating mottles and the like are made.

As shown in FIG. 8(*b*), in the conventional coating treatment method, in order to apply the resist solution without any mottle, a necessary discharging amount of the resist solution was about 1.2 ml. On the other hand, as shown in FIG. 8(*a*), in the coating treatment method of this embodiment, it was possible to properly apply the resist solution even when the discharging amount of the resist solution was about 1.1 ml.

It can be confirmed from this experiment that the coating treatment method of this embodiment enables the uniform application of the resist solution on the surface of the wafer even when an amount of the resist solution is small, as contrast to the conventional method.

Figure 9:
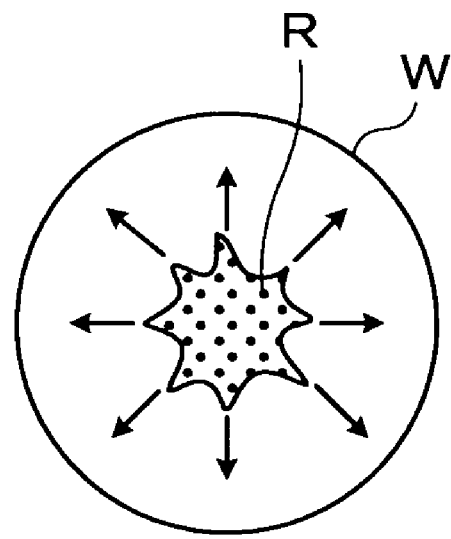
FIG. 9(a) is an explanatory view showing how the resist solution spreads when the conventional coating treatment method is used.
FIG. 9(b) is an explanatory view showing how the resist solution spreads when the coating treatment method in this embodiment is used.
Figure 9:
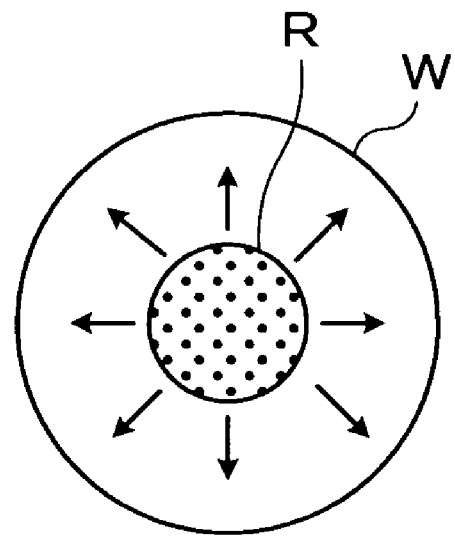

Further, the following can be thought to be one of the reasons why the use of the coating treatment method of this embodiment can reduce the coating mottles even when an amount of the resist solution is small. For example, when the rotation speed of the wafer W is increased at a time in the coating step and thus the wafer W is rotated at a high speed from the beginning of the coating step as has been conventionally done, a strong centrifugal force works on the resist solution R immediately after the resist solution R is supplied to the center portion of the wafer W as shown in FIG. 9(a). This causes the resist solution R to spread in irregular streaks in an outward direction. When an amount of the resist solution R is small, mottles in a streak shape remain as the coating mottles when the resist solution R thereafter spreads all over the surface of the wafer W. On the other hand, when the rotation speed of the wafer W is controlled in the S-shape as in this embodiment, the rotation speed of the wafer W does not greatly change but is kept low immediately after the resist solution is supplied to the center portion of the wafer W, and therefore, a strong centrifugal force does not work on the resist solution R, so that the resist solution R uniformly spreads in the outward direction as shown in FIG. 9(b). Further, since the rotation speed of the wafer W thereafter continuously changes, the resist solution R on the wafer W smoothly spreads, which is thought to be the reason why the coating mottles are not made even when an amount of the resist solution is small.

In the above-described embodiment, the discharging of the resist solution by the first nozzle 143 in the coating step S3 may be continued up to the middle of the planarization step S4, and when the discharging of the resist solution is to be finished, the first nozzle 143 may be moved so as to deviate the discharging position of the resist solution from the center portion of the wafer W.

Figure 10:
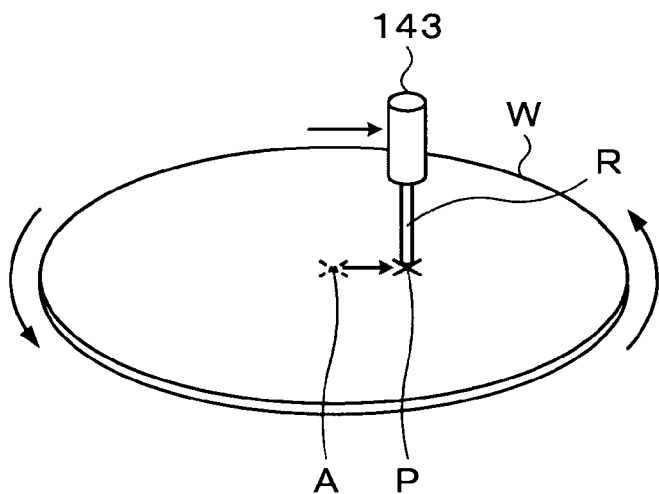
FIG. 10 is an explanatory view showing a state where a first nozzle is moved to deviate a discharging position of the resist solution from a center portion of a wafer.
Figure 11:
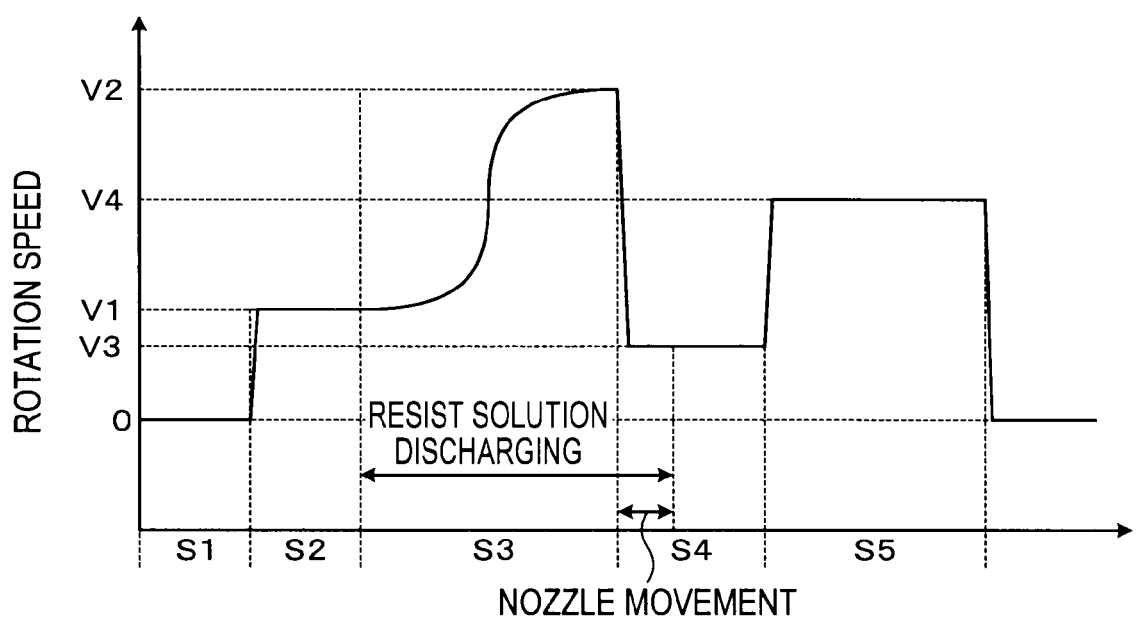
FIG. 11 is a graph showing the rotation speed of the wafer in each of the steps of the resist coating treatment in the case where the discharging position of the resist solution is deviated.

For example, simultaneously with the end of the coating step S3, the first nozzle 143 moves in the diameter direction of the wafer W from the position above the center portion of the wafer W by a predetermined distance, for example, 5 mm or more, more preferably, about 5 mm to about 30 mm while continuously discharging the resist solution R, as shown in FIG. 10. Consequently, a discharging position P of the resist solution on the surface of the wafer W is deviated from the center portion A of the wafer W. The rotation speed of the wafer W at this time has been changed to the third speed V3 which is a low speed of about 100 rpm. The first nozzle 143 stops at a position deviated by the predetermined distance from the position above the center portion A of the wafer W, and the valve 148 is closed at this time to stop the discharging of the resist solution. Thereafter, the wafer W is continuously rotated at the third speed V3 and thus the resist solution on the wafer W is smoothed to be planarized. That is, the discharging of the resist solution is continued from the coating step S3 of the resist solution up to the middle of the planarization step S4 of the resist solution, and when the discharging of the resist solution is to be finished in the planarization step S4, the first nozzle 143 moves so that the discharging position P of the resist solution is deviated from the center portion A of the wafer W.

According to this example, since the remaining resist solution dripping off from the first nozzle 143 drops onto the wafer W rotating at the low speed for the planarization step S4, the resist solution is prevented from being rapidly dried. In addition, since the resist solution drops to the position P deviated from the center portion A of the wafer W, the resist solution properly spreads on the surface of the wafer by a stronger centrifugal force than when it drops to the center portion of the wafer W. As a result, even when the resist solution in an unstable amount or in an unstable shape is discharged at the end of the discharging by the first nozzle 143, no coating mottle is made near the center portion of the wafer W, which makes it possible to finally form the uniform resist film on the entire surface of the wafer W even when an amount of the resist solution used is small. The results of experiments verifying this effect will be shown below.

Figure 12:
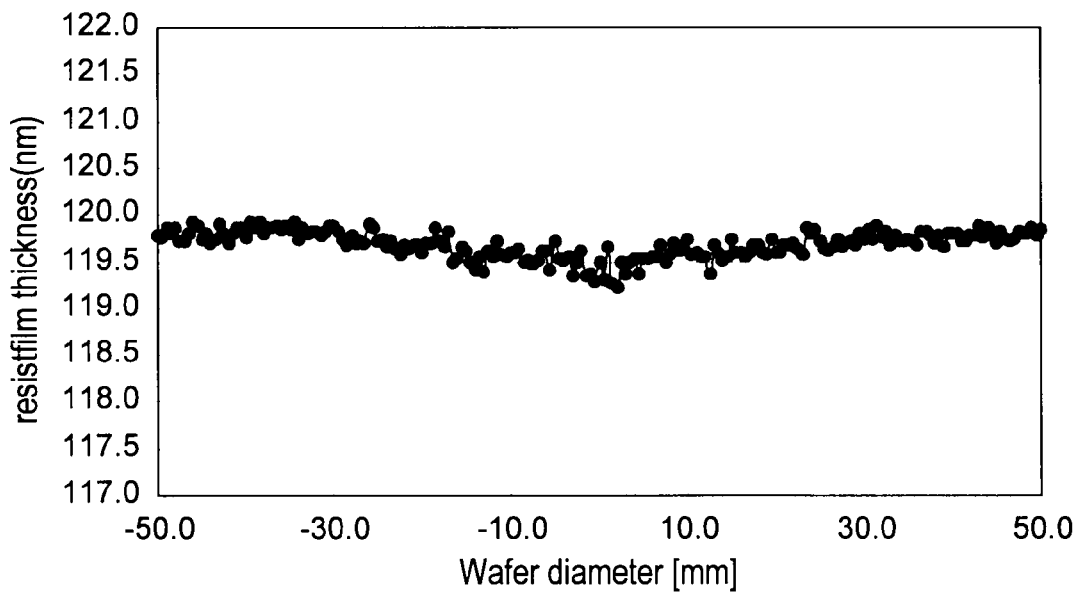
FIG. 12 is a graph showing the measurement result of the thickness of a resist film on a wafer surface when the coating treatment method in this embodiment is used.
Figure 13:
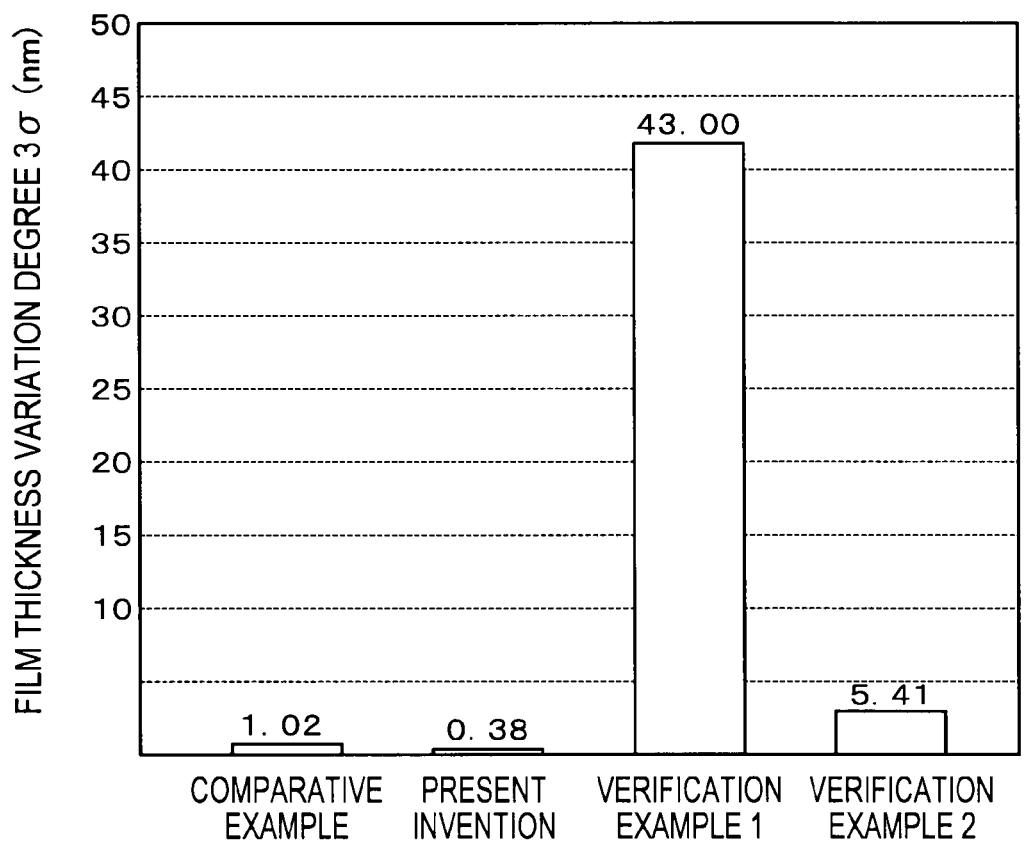
FIG. 13 is a graph showing variation degrees of the thickness of the resist film on the wafer surface when various coating treatment methods are used.

FIG. 12 shows the result of an experiment in which the thickness of the resist film on the surface of the wafer was measured, when the coating treatment method of the above-described embodiment was used. From the experiment result, it can be confirmed that there is no variation in the thickness of the resist film on the center portion of the wafer W and thus the resist film is formed uniformly on the surface of the wafer. Further, FIG. 13 is a graph showing variation degrees (3σ) of the thickness of the resist film near the center of the wafer when various kinds of coating treatment methods are used. It can be also confirmed from FIG. 13 that the variation of the thickness of the resist film is remarkably reduced to 0.5 nm or less when the coating treatment method of this embodiment is used (in the case of the present invention), as contrast to the case of a comparative example where the nozzle is not moved from the center portion of the wafer W.

In this embodiment, the discharging end timing of the resist solution is set in the middle of the planarization step S4 and the discharging position P of the resist solution is deviated by the movement of the first nozzle immediately before the discharging of the resist solution is finished. Here, the appropriateness of the discharging end timing of the resist solution and the necessity of the deviation of the discharging position P of the resist solution in this case will be verified.

Figure 14:
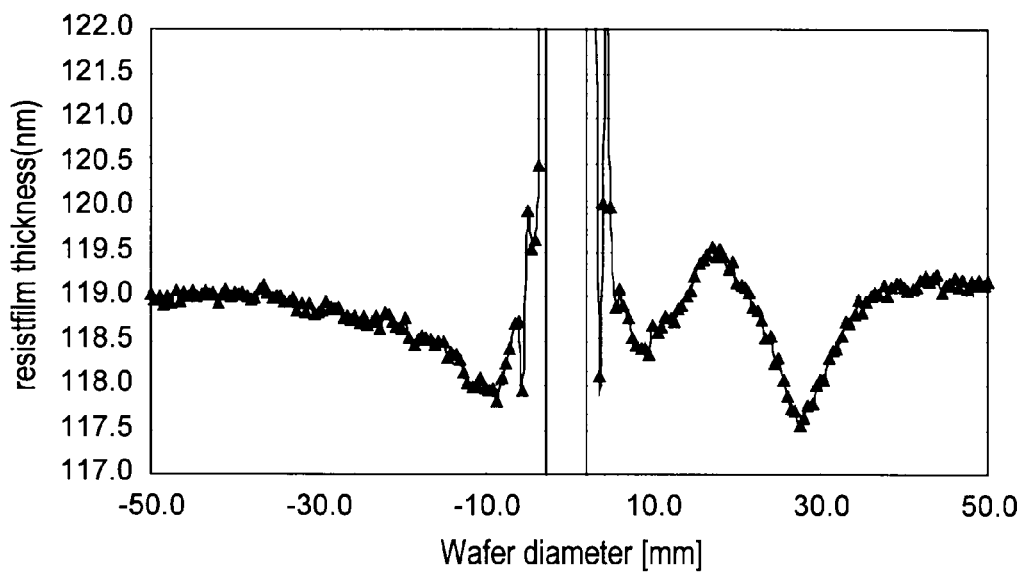
FIG. 14 is a graph showing the result of the measurement of the thickness of the resist film on the surface of the wafer when a coating treatment method of a verification example 1 is used.

FIG. 14 shows the result of an experiment where the thickness of the resist film on the surface of the wafer is measured in a case where the discharging position P of the resist solution is deviated from the center portion of the wafer W by the movement of the nozzle in the middle of the coating step S3 and the discharging of the resist solution is ended simultaneously with the end of the coating step S3, that is, when the discharging end timing of the resist solution is set at the end of the coating step S3 and the discharging position P of the resist solution is deviated. Further, FIG. 13 shows a variation degree (3σ) of the thickness of the resist film near the center of the wafer in this case (verification example 1).

Figure 15:
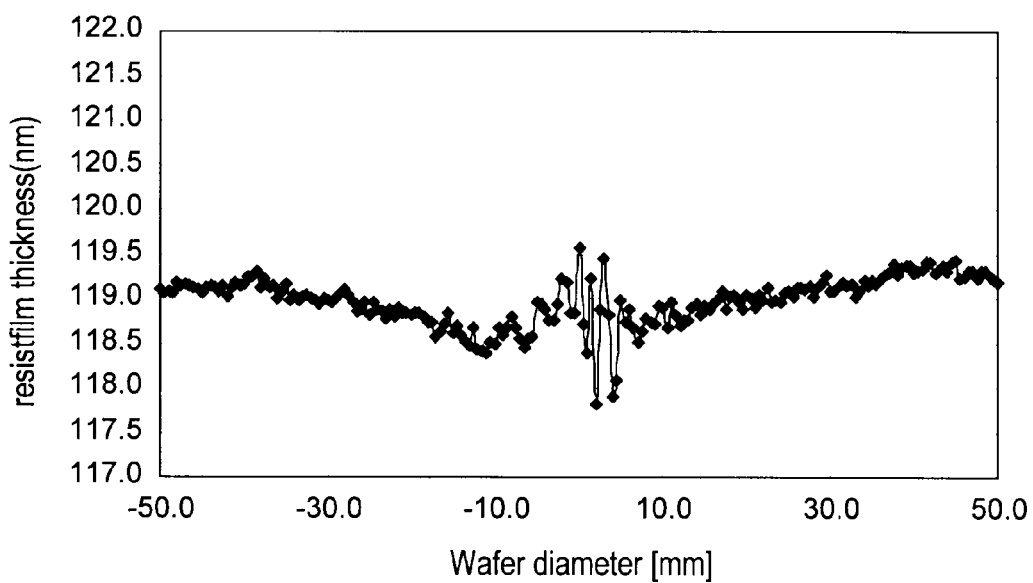
FIG. 15 is a graph showing the result of the measurement of the thickness of the resist film on the surface of the wafer when a coating treatment method of a verification example 2 is used.

FIG. 15 shows the result of an experiment where the thickness of the resist film on the surface of the wafer is measured in a case where the discharging of the resist solution is continued from the coating step S3 up to the middle of the planarization step S4 while the nozzle is fixed at the position above the center portion of the wafer W, that is, when the discharging end timing of the resist solution is set in the middle of the planarization step S4 and the discharging position P of the resist solution is not deviated. FIG. 13 shows a variation degree (3σ) of the thickness of the resist film near the center of the wafer in this case (verification example 2).

According to the verification example 1 shown in FIG. 13 and FIG. 14, it is confirmed that, when the discharging position P of the resist solution is deviated in the middle of the coating step S3 and then the discharging of the resist solution is ended, the film thickness of the resist solution near the center of the wafer W is noticeably varied and the film thickness variation degree on the surface of the wafer is extremely large. This is thought to be caused because the wafer is dried before the resist solution discharged to the center portion of the wafer does not sufficiently spread.

According to the verification example 2 shown in FIG. 13 and FIG. 15, it is confirmed that, when the discharging position P of the resist solution is not deviated and the discharging of the resist solution is continued up to the middle of the planarization step S4, the same problem as that in the conventional example occurs regarding the film thickness of the resist solution near the center of the wafer W and thus the film thickness variation degree on the surface of the wafer is not solved.

Therefore, it is confirmed that, only when the discharging of the resist solution is continued up to the middle of the planarization step S4 and the discharging position P of the resist solution is deviated from the center portion of the wafer W immediately before the discharging end of the resist solution as in this embodiment, uniformity of the resist film on the surface of the wafer can be remarkably improved.

Figure 16:
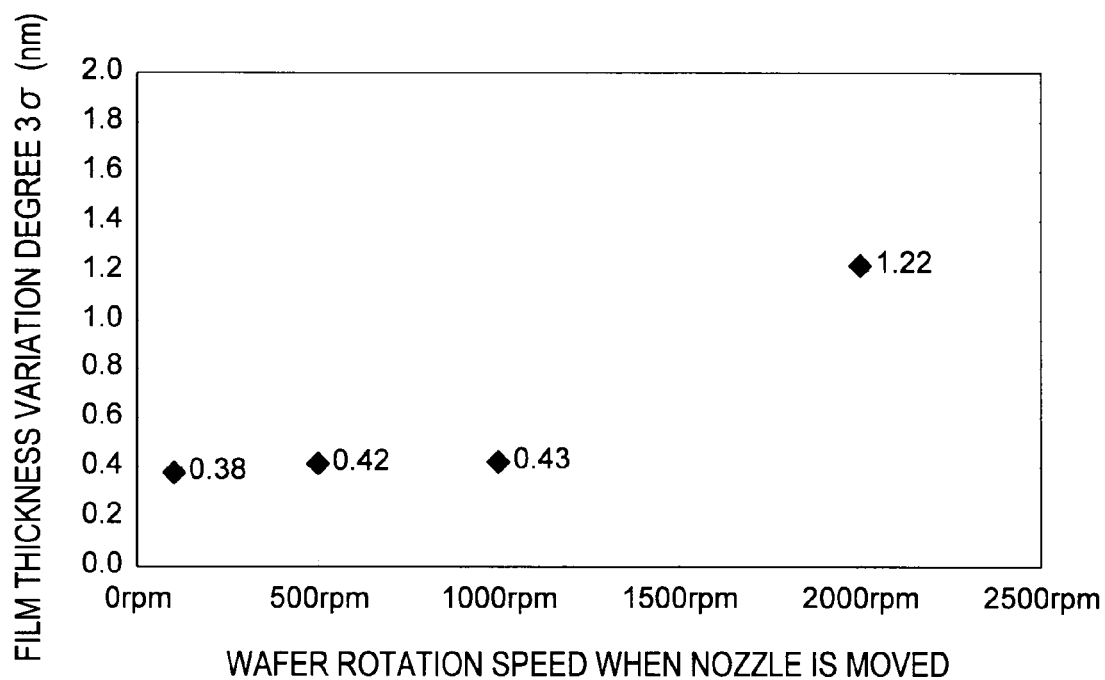
FIG. 16 is a graph showing a variation degree of the thickness of the resist film near the center of the wafer, with the rotation speed of the wafer when the nozzle moves being varied.

FIG. 16 shows the result of an experiment, showing the variation degree (3σ) of the thickness of the resist film near the center of the wafer, with the rotation speed of the wafer W at the time of the movement of the first nozzle 143 being varied. It is seen from FIG. 16 that, when the rotation speed is set at 1000 rpm or lower, the variation degree of the thickness of the resist film is reduced to an extremely small value of 0.5 nm or less. Therefore, by setting the rotation speed of the wafer W to 1000 rpm or less when the nozzle 143 is deviated from the position above the center portion A of the wafer W as in the above-described embodiment, it is possible to remarkably solve the variation of the thickness of the resist film. Preferably, the rotation speed of the wafer W when the nozzle is moved is 50 rpm or more, considering that the film is planarized in the planarization step S4.

Figure 17:
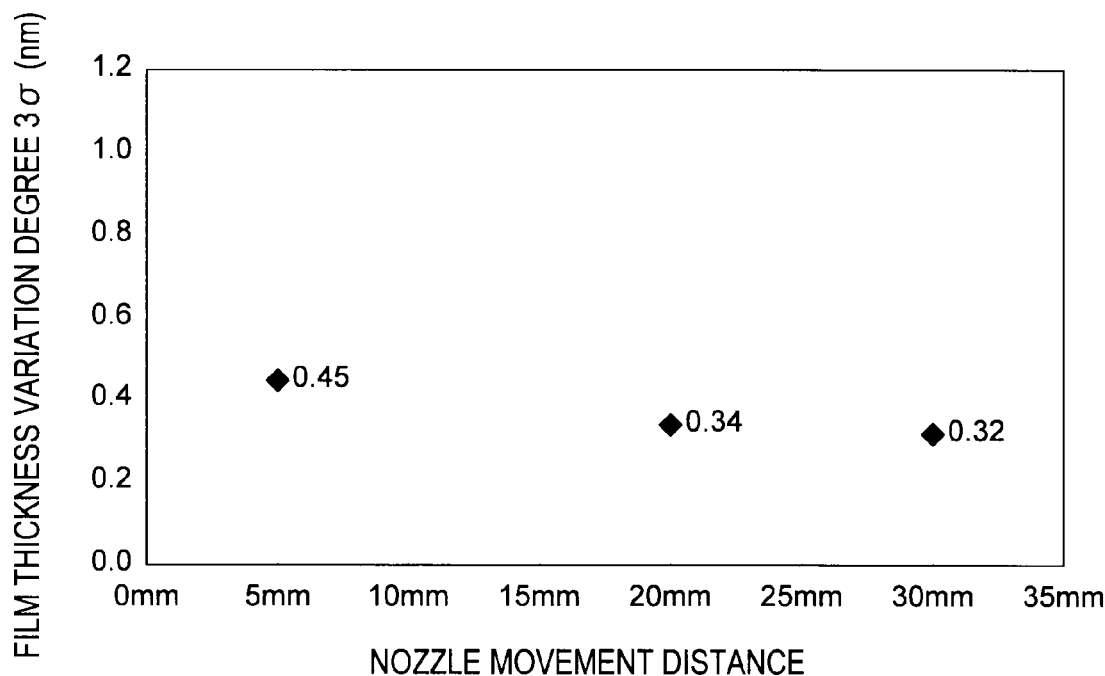
FIG. 17 is a graph showing a variation degree of the thickness of the resist film near the center of the wafer, with a deviation distance of the nozzle being varied.

FIG. 17 shows the result of an experiment, showing a variation degree (3σ) of the thickness of the resist film near the center of the wafer, with a deviation amount of the first nozzle 143 being varied. It is seen from FIG. 17 that, when the deviation amount is 5 nm or more, the variation degree of the thickness of the resist film is reduced to an extremely small value of 0.5 nm or less. Therefore, by deviating the discharging position P of the resist solution by 5 mm or more from the center portion A of the wafer W as in the above-described embodiment, it is possible to greatly solve the variation of the thickness of the resist film on the surface of the wafer W.

In the above-described embodiment, the movement of the first nozzle 143 is started simultaneously with the end of the coating step S3, but this movement start timing may be before the end of the coating step S3. This makes it possible to finish the movement of the first nozzle 143 at an earlier stage and the discharging of the resist solution can be accordingly ended at an earlier stage in the planarization step S4. As a result, an amount of the resist solution used in the whole process can be reduced, realizing cost reduction. More preferably, the movement of the first nozzle 143 is started after 50% or more of the coating step S3 is completed, considering the diffusion of the resist solution all over the surface of the wafer.

In the above-described embodiment, the drying step S5 is executed for a preset time, but another alternative is to continuously detect the film thickness of the resist solution on the wafer W by a sensor at least during the drying step 5 and finish the drying at an instant when the film thickness changes no longer. It has been confirmed that the film thickness does not change and converges in a fixed value when the resist solution becomes dry, and therefore, according to this method, it is possible to accurately determine the end timing of the drying. In such a case, since the drying time can be controlled individually according to, for example, the kind of the resist solution and the rotation speed when the wafer W is dried, there is not need to set the long drying time as has been conventionally done, which enables earlier shift to the next step of the wafer processing. As a result, a throughput of the wafer processing can be improved.

Hitherto, the preferred embodiment of the present invention is described with reference to the accompanying drawings, but the present invention is not limited to such an example. It is obvious that those skilled in the art could come up with various modified examples and corrected examples within the scope of the idea described in the claims, and it is understood that these examples naturally belong to the technical scope of the present invention.

For example, the above embodiment describes, as an example, the coating treatment in which the resist solution is applied, but the present invention is also applicable to coating treatment in which the applied coating solution is not the resist solution but, for example, any of coating solutions for forming an anti-reflection film, a SOG (Spin On Glass) film, a SOD (Spin On Dielectric) film, and the like. Further, the above embodiment describes the coating treatment for the wafer W as an example, but the present invention is also applicable to coating treatment for substrates other than the wafer, such as, for example, substrates of a FPD (flat panel display) and a photomask mask reticle.

The present invention is useful for applying a coating solution without making any coating mottle even when an amount of the coating solution used is small.

What is claimed is:

1. A coating treatment method for a substrate, comprising:
    a first step of discharging a coating solution from a nozzle to a center portion of the substrate while rotating the substrate, to apply the coating solution on a surface of the substrate;
    a second step of decelerating, after said first step, the rotation of the substrate and continuously rotating the substrate; and
    a third step of accelerating, after said second step, the rotation of the substrate to dry the coating solution on the substrate, wherein:
    the substrate is rotated at a fixed speed of a first speed immediately before said first step; and
    in said first step, the rotation of the substrate which is at the first speed before start of said first step is gradually accelerated after the start of said first step so as to make the speed continuously change, and the acceleration of the rotation of the substrate is gradually decreased so as to make the speed of the rotation of the substrate converge in a second speed higher than the first speed at end of said first step; wherein
    the discharging of the coating solution from the nozzle in said first step is continued until a middle of said second step, and before the discharging of the coating solution is finished, the nozzle is moved to a different position than a discharging position of the coating solution from the center portion of the substrate.

2. The coating treatment method according to claim 1, wherein
    movement of the nozzle is started simultaneously with the end of said first step.

* * * * *